United States Patent
Gooding et al.

[19]

[11] Patent Number: 6,101,052
[45] Date of Patent: Aug. 8, 2000

[54] H CONFIGURATION WRITE DRIVER CIRCUIT WITH INTEGRAL COMPONENT FAULT DETECTION

[75] Inventors: Gary Francis Gooding; Larry Leeroy Tretter, both of Tucson, Ariz.

[73] Assignee: International Business Machines Corporation, Armonk, N.Y.

[21] Appl. No.: 08/075,627

[22] Filed: Jun. 14, 1993

[51] Int. Cl.[7] .................................................. G11B 5/09
[52] U.S. Cl. ............................ 360/46; 360/68; 360/113
[58] Field of Search ................................. 714/7; 360/46, 360/113, 68; 330/288

[56] References Cited

U.S. PATENT DOCUMENTS

| | | | |
|---|---|---|---|
| 3,010,079 | 11/1961 | Straube | 327/423 |
| 3,037,200 | 5/1962 | Mellott . | |
| 3,927,333 | 12/1975 | Furuhashi | 327/423 |
| 4,015,290 | 3/1977 | Bowers | 360/63 |
| 4,477,846 | 10/1984 | Cottrell et al. | 360/46 |
| 4,489,285 | 12/1984 | Sato | 330/288 |
| 4,551,772 | 11/1985 | Sliger | 360/46 |
| 5,101,153 | 3/1992 | Morong | 324/158 R |

*Primary Examiner*—Phung M. Chung
*Attorney, Agent, or Firm*—Dan A. Shifrin; Andrew J. Dillon

[57] ABSTRACT

An H configuration write driver circuit is provided which includes integral fault detection circuitry. A load device, such as a magnetic tape recorder write head, is coupled in an H configuration with four drive transistors. A first and second drive transistor are coupled to opposite ends of the load device and produce current flow through the load device in a first direction. A third and fourth drive transistor are coupled to opposite ends of the load device to produce current flow through the load device in the opposite direction. A resistor is coupled in series between each drive transistor and the load device and these resistors serve to determine the time constant of the rise/fall of current through the inductive write head and to limit current flow through a drive transistor in the event of a short circuit condition therein. Voltage measurement nodes are provided in association with each resistor and the voltage at each node is compared to a predetermined reference voltage in order to produce multiple fault detection signals which may be utilized to accurately identify specific component fault conditions within the driver circuit.

6 Claims, 4 Drawing Sheets

H CONFIGURATION WRITE DRIVER CIRCUIT WITH INTEGRAL COMPONENT FAULT DETECTION

BACKGROUND OF THE INVENTION

1. Technical Field

The present invention relates in general to improved H configuration drive circuits and in particular to an improved H configuration drive circuit which includes fault detection and protection circuitry. Still more particularly, the present invention relates to a magnetic tape recorder write head drive circuit which provides integral component fault detection signals which may be utilized to identify component failures.

2. Description of the Related Art

H configuration drive circuits are well known in the prior art. Such circuits are typically utilized in applications in which current is to be supplied in one of two directions to a load, such as a magnetic write recording head. In such circuits, power dissipation is a significant concern. For example, in tape recorder units a need has been recognized for smaller tape products. However, in such small products little or no space is available for cooling fans or similar devices. Pockets of thermal energy or hot spots are then created which may have a deleterious effect on the electronics circuitry within the tape product. Hence, there is an ongoing and recognized effort to reduce the power dissipated by the write driver circuit within small form factor tape units to minimize the amount of heat generated thereby.

An early example of an H configuration driver circuit is disclosed in U.S. Pat. No. 3,037,200, issued to Robert N. Mellott and entitled "Computer Magnetic Drum Writing Circuits." This patent discloses a tandem amplifier system which utilizes four amplifiers to control the energization of a load by the circuit in response to bivalued input signals. A similar H configuration driver circuit is disclosed in "Predriver for 'H' Configured Write Driver for Magnetic Recording" by J. A. Bailey, R. G. Black, Jr., and J. Lewkowicz, IBM Technical Disclosure Bulletin, Volume 23, No. 11, November 1981, which discloses a write driver for a thin film magnetic write head. The driver transistors therein are connected in an H configuration with two driver transistors being turned on to produce current through the head in one direction and the other being turned on to provide current through the head in the other direction. In such a circuit the voltage excursions on the two sides of the head are not equal and opposite. Thus, transients may be capacitively coupled to the read circuitry.

More recently, U.S. Pat. No. 4,551,772 issued to David E. Sliger and assigned to Storage Technology Corporation discloses a write drive circuit which utilizes current mirrors to reduce feed-through. Additionally, an H write driver utilizing a plurality of bipolar drive transistors has been disclosed in U.S. patent application Ser. No. 07/991,864, filed Dec. 15, 1992, and assigned to the Assignee herein named. In the aforementioned application, a novel circuit is included for driving the upper bipolar drive transistor wherein the transistor is adapted to sense the output of the drive transistor and regulate a voltage at the input thereof in response thereto in order to keep the drive transistor out of the saturation region.

Thus, those having skill in the art will appreciate that H write driver circuits are relatively fast and have generally low power dissipation. However, an increased desire on the part of consumers of such devices for higher reliability and serviceability has created a need for driver circuits which include integral component fault detection for efficiently detecting component failures within a so-called "Field Replaceable Unit" (FRU) such that service personnel may rapidly and efficiently determine which component has failed, in order to facilitate repair or replacement of that device. It should therefore be apparent that an H write driver circuit having integral component fault detection circuitry would be highly desirable.

SUMMARY OF THE INVENTION

It is therefore one object of the present invention to provide an improved H configuration driver circuit.

It is another object of the present invention to provide an improved H configuration driver circuit which includes fault detection and protection circuitry.

It is yet another object of the present invention to provide a magnetic tape recorder write head drive circuit which provides integral fault detection signals which may be utilized to identify component failures.

The foregoing objects are achieved as is now described. An H configuration write driver circuit is disclosed which includes integral fault detection circuitry. A load device, such as a magnetic tape recorder write head, is coupled in an H configuration with four drive transistors. A first and second drive transistor are coupled to opposite ends of the load device and produce current flow through the load device in a first direction. A third and fourth drive transistor are coupled to opposite ends of the load device to produce current flow through the load device in the opposite direction. A resistor is coupled in series between each drive transistor and the load device and these resistors serve to determine the time constant of the rise/fall of current through the inductive write head and to limit current flow through a drive transistor in the event of a short circuit condition therein. Voltage measurement nodes are provided in association with each resistor and the voltage at each node is compared to a predetermined reference voltage in order to produce multiple fault detection signals which may be utilized to accurately identify specific component fault conditions within the driver circuit.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
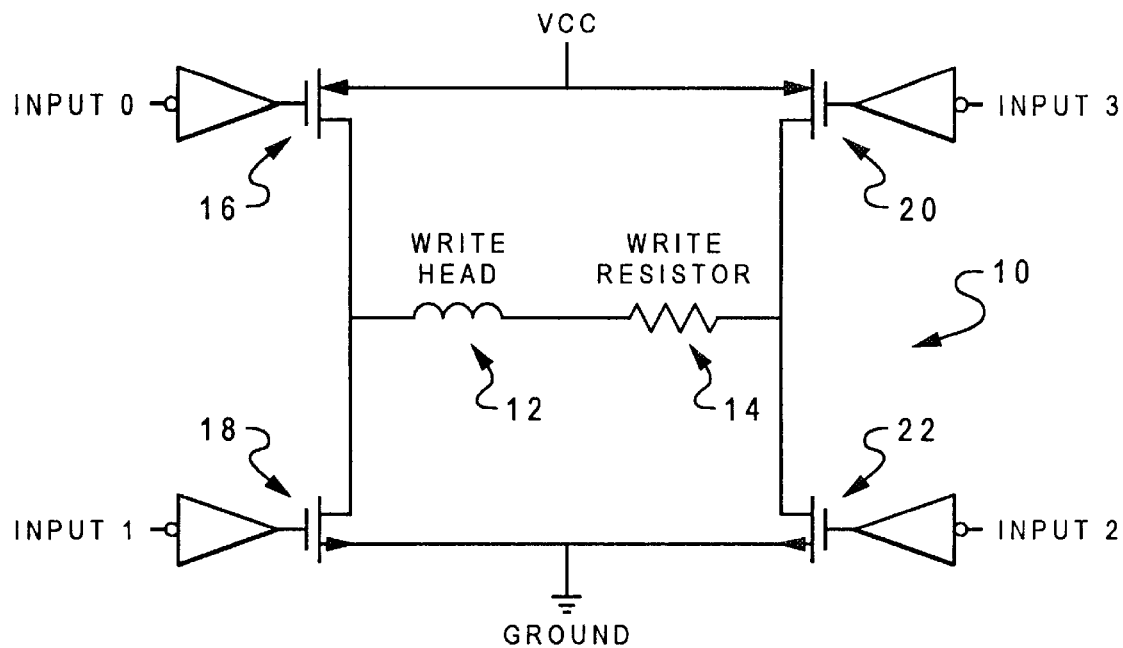
FIG. 1 a schematic representation of a prior art H configuration write driver circuit.

With reference now to the Figures and in particular with reference to FIG. 1, there is depicted a schematic representation of a prior art H configuration write driver circuit 10. As illustrated, H configuration write driver circuit 10 is utilized to provide bidirectional current flow through write head 12 and write resistor 14. In practice, a plurality of inputs are utilized to control the conductivity of multiple field effect transistors 16, 18, 20, and 22. Thus, input 0 and input 2 are utilized to place field effect transistors 16 and 22 in a conductive state while transistors 18 and 20 are rendered nonconductive. Thus, current will flow through write head 12 in a first direction from left to right. Alternately, inputs 1 and 3 may be utilized to bias transistors 18 and 20 into a conductive state, while transistors 16 and 22 remain nonconductive. In this manner current will be produced through write head 12 in a second direction, from right to left.

Figure 2:
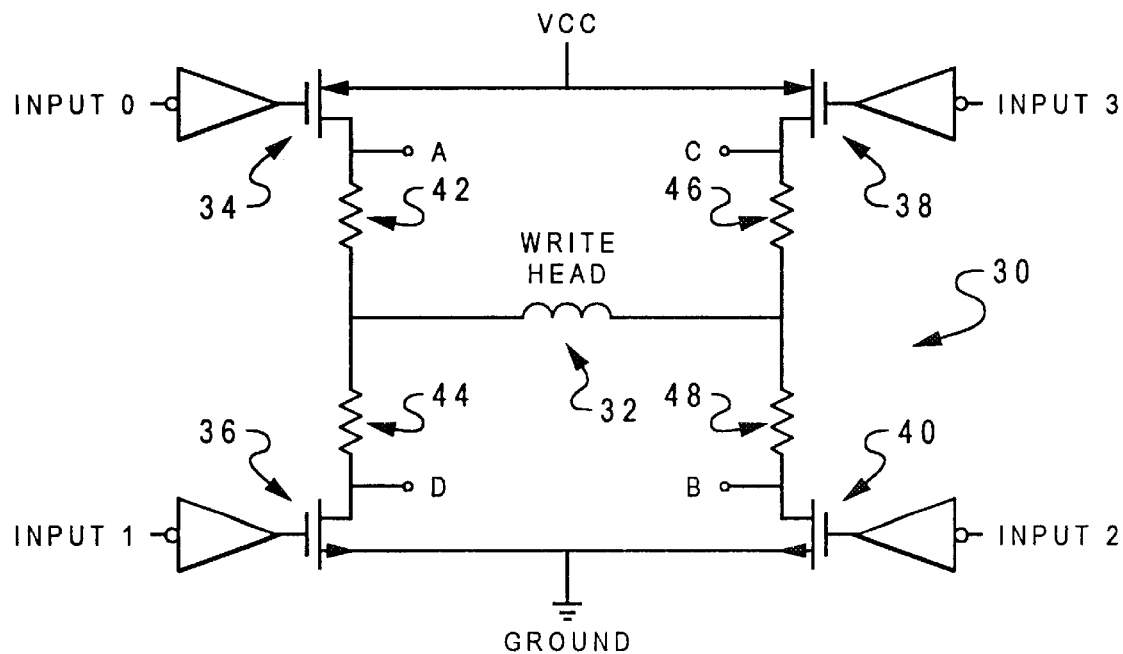
FIG. 2 is a schematic representation of an H configuration write driver circuit having integral fault detection circuitry which is constructed in accordance with the present invention.

Referring now to FIG. 2, there is depicted a schematic representation of an H configuration write driver circuit having integral fault detection circuitry which is constructed in accordance with the present invention. As illustrated, H configuration write driver circuit 30 of FIG. 2 is generally similar in construction to the prior art H configuration write driver circuit of FIG. 1; however, write resistor 14 has been removed from the center leg of the H configuration and multiple resistors 42, 44, 46, and 48 are provided. As illustrated, each such resistor is coupled in series between a drive transistor and write head 32.

Thus, input 0 and input 2, together referred to as "WRITE AB," may be utilized to cause drive transistors 34 and 40 to conduct, while maintaining drive transistors 36 and 38 in a nonconductive state. In this type of operation, current will flow through resistor 42, write head 32 and resistor 48. Alternately, inputs 1 and 3, together referred to as "WRITE CD," may be utilized to bias field effect transistors 36 and 38 into a conductive state, causing current to flow through resistor 46, write head 32 and resistor 44, in an opposite direction to the previous condition. Upon reference to the foregoing those skilled in the art will appreciate that by placing a resistor in series between each drive transistor and write head 32, a fault situation resulting from a short circuit condition within any field effect transistor will not result in high levels of current flowing through that transistor, due to the placement of an associated resistor.

In accordance with an important feature of the present invention, a voltage measurement node is provided in association with each resistor. Thus, voltage measurement node A is provided in association with resistor 42 while voltage measurement node D is provided in association with resistor 44. Similarly, voltage measurement node C is provided in association with resistor 46 and voltage measurement node B is provided in association with resistor 48. Thus, for a nominal supply voltage of five volts, if each resistor provided within H write driver circuit 30 is approximately 20 ohms, a nominal write current of 110 milliamps will be provided. In this manner, the voltage present at each voltage measurement node may be utilized to detect component failures within H configuration write driver circuit 30.

Of course, those skilled in the art will appreciate that a pull-up resistor should be provided in association with voltage measurement nodes A and C, as well as a pull-down resistor in association with voltage measurement nodes B and D, to ensure correct fault detection during a circuit failure. In this manner, specific write circuit failures may be determined by noting the voltage present at each voltage measurement node. The following table depicts how each specific write circuit failure may be detected:

TABLE 1

| WRITE CIRCUIT FAILURE | RESULT |
| --- | --- |
| Open Driver 34 | Voltage measurement Node A will equal 0.0 volts when it should equal 5.0 volts |
| Open Driver 36 | Voltage measurement Node D will equal 5.0 volts when it should equal 0.0 volts |
| Open Driver 38 | Voltage measurement Node C will equal 0.0 volts when it should equal 5.0 volts |
| Open Drier 40 | Voltage measurement Node B will equal 5.0 volts when it should equal 0.0 volts |
| Shorted Driver 34 | Voltage measurement Node A will equal 5.0 volts when it should equal 2.5 volts |
| Shorted Driver 36 | Voltage measurement Node D will equal 0.0 volts when it should equal 2.5 volts |
| Shorted Driver 38 | Voltage measurement Node C will equal 5.0 volts when it should equal 2.5 volts |
| Shorted Driver 40 | Voltage measurement Node B will equal 0.0 volts when it should equal 2.5 volts |
| Open Resistor 42 | Voltage measurement Node D will equal 0.0 volts when it should equal 2.5 volts |
| Open Resistor 48 | Voltage measurement Node C will equal 5.0 volts when it should equal 2.5 volts |
| Open Resistor 46 | Voltage measurement Node B will equal 0.0 volts when it should equal 2.5 volts |
| Open Resistor 44 | Voltage measurement Node A will equal 5.0 volts when it should equal 2.5 volts |
| Open Write Head Node | if WRITE AB is active then: Voltage measurement D equals 5.0 volts when it should equal 2.5 volts and Node C equals 0.0 volts when it should equal 2.5 volts |
| Open Write Head | if WRITE CD is active then: Voltage measurement Node B equals 5.0 volts when it should equal 2.5 volts and Node A equals 0.0 volts when it should equal 2.5 volts |

For purposes of this illustration, Table 1 assumes that the voltage drop across each field effect transistor is zero and the write head includes zero ohms of resistance. In actual circuit design, the voltage across a conducting drive transistor will vary between 0.1 and 0.35 volts and the write head resistance is approximately equal to one-half the resistance of a write resistor. Thus, a slight shift in the values of the above table may occur. This slight difference may be accounted for by utilizing four different reference voltages VREF 1–VREF 4. These values have been empirically derived for each possible fault within the H configuration write driver of the present invention and these reference voltages have been calculated as follows: VREF 1 equal 3.3 volts; VREF 2 equal 1.7 volts; VREF 3 equal 4.0 volts; and VREF 4 equal 1.0 volts for a 5 volts system.

Figure 3:
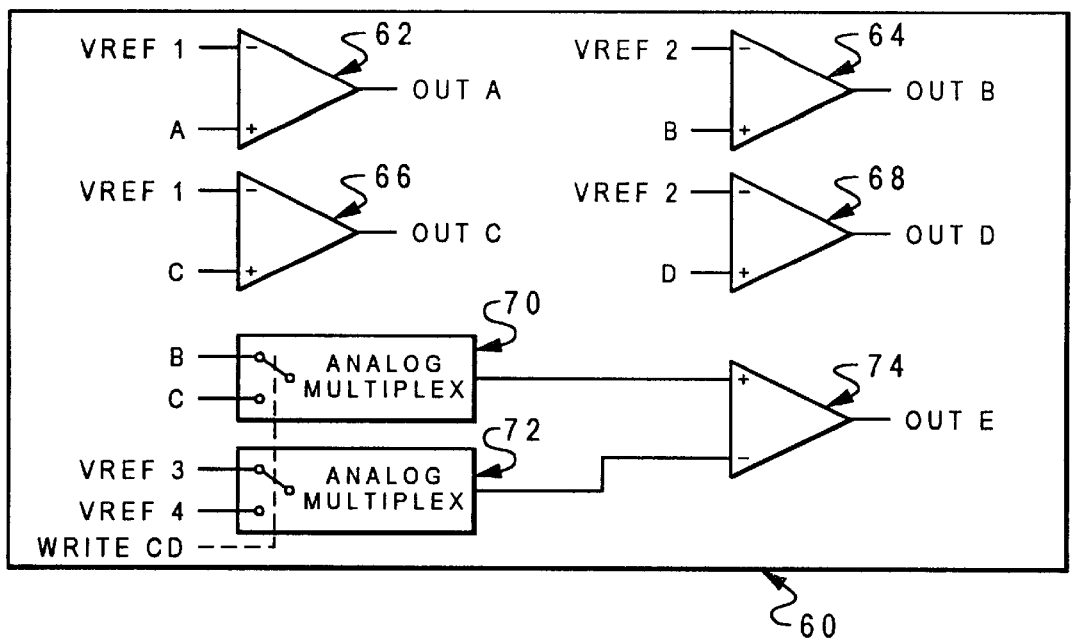
FIG. 3 is a schematic representation of a component failure identification signal generation circuit constructed in accordance with the present invention.

With reference now to FIG. 3, there is depicted a schematic representation of a component failure identification signal generation circuit 60 which is constructed in accordance with the present invention. As illustrated, the output of each voltage measurement node is coupled to an associated comparator 62, 64, 66 and 68, in conjunction with the aforementioned reference voltages. The output of each comparator then comprises digital signal which may be utilized as a fault detection signal, as will be explained in greater detail herein. Similarly, the outputs of voltage measurement nodes B and C, as well as reference voltages 3 and 4, may each be coupled to an analog multiplex 70 and 72, and switched in response to a transition of the Write CD transition. The outputs of these two analog multiplexs are then coupled to comparator 74 to generate a fault detection signal OUT E.

Figure 4:
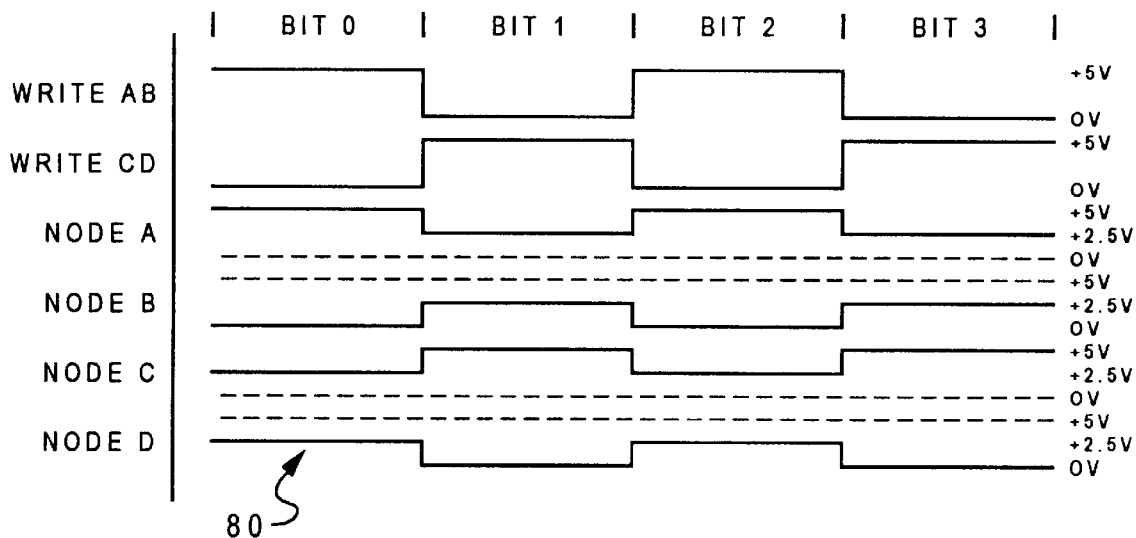
FIG. 4 is a pictorial representation of the voltage waveforms present at each voltage measurement node of the H configuration write driver circuit of the present invention during normal write operations.

Referring now to FIG. 4, there is depicted a pictorial representation of the voltage waveforms present at each voltage measurement node of the H configuration write driver circuit 30 of FIG. 2 during normal write operations. As illustrated, the WRITE AB and WRITE CD signals are toggled for successive bits during a sample write operation. The output of voltage measurement node A thus varies between 5 volts and 2.5 volts, for the nominal values set forth above. Similarly, the voltage present at voltage measurement node B will vary between 0 volts and 2.5 volts in the manner depicted. The voltage present at voltage measurement nodes C and D will also vary as illustrated at reference numeral 80 within FIG. 4.

Figure 5:
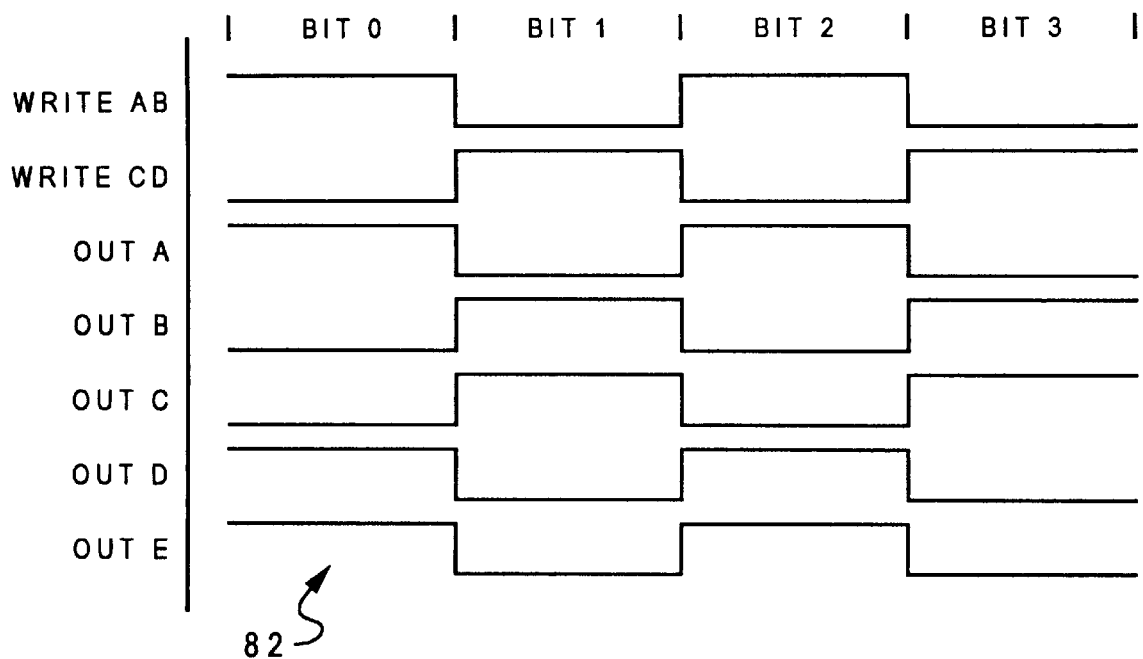
FIG. 5 is a pictorial representation of a plurality of fault detection signals within the H configuration write driver circuit of the present invention during normal write operations.

With reference now to FIG. 5, there is depicted a pictorial representation of a plurality of fault detection signals within H configuration write driver circuit 30 of FIG. 2 which have been generated utilizing component failure identification signal generation circuit 60 of FIG. 3. These digital signals may be created utilizing the reference voltages and outputs detected at each voltage measurement node, as described above. Thus, the fault detection signals OUT A, OUT B, OUT C, OUT D and OUT E may be created as depicted at reference numeral 82 of FIG. 5, for normal write operation. As illustrated, these fault detection signals "toggle" during each transition of the write signals, providing an indication of proper functional operation of each comparator depicted in FIG. 3.

Figure 6:
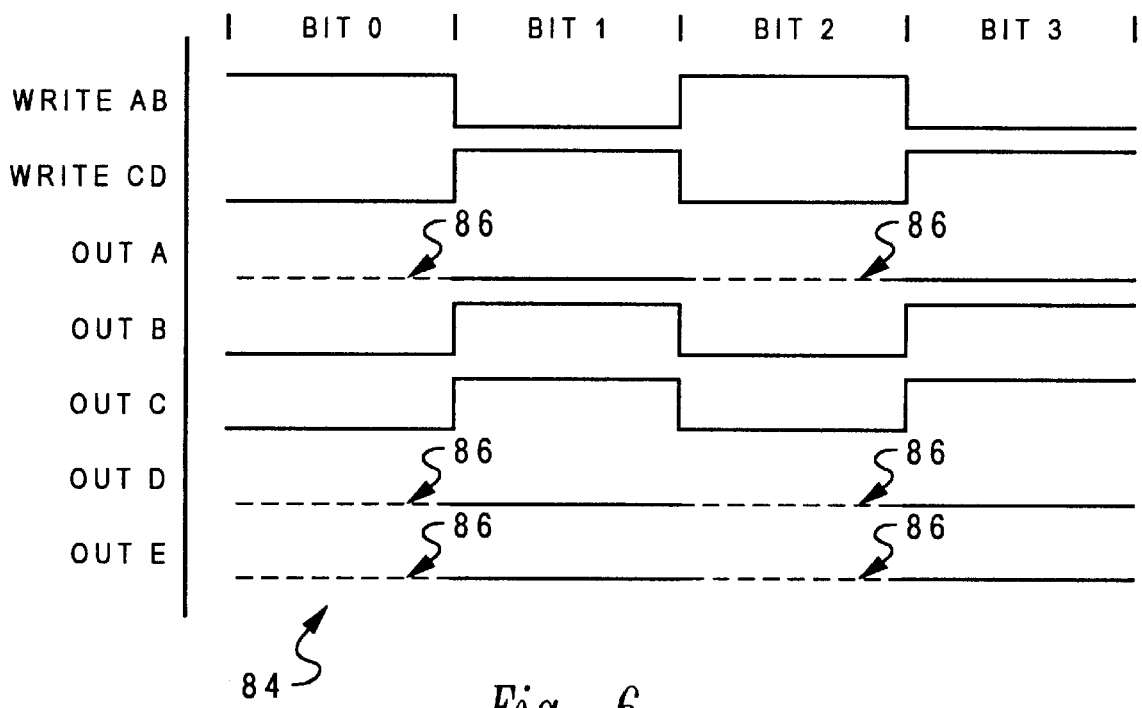
FIG. 6 is a pictorial representation of a plurality of unique fault detection signals within the H configuration write driver circuit of the present invention illustrating a specific component fault condition.

Referring now to FIG. 6, there is depicted a pictorial representation of a plurality of unique fault detection signals within H configuration write driver circuit 30 of FIG. 2 which illustrate a specific component condition. The fault detection signals depicted within FIG. 6, at reference numeral 84, are those signals which will occur as a result of an open drive transistor 34. As illustrated, fault conditions may be detected at each reference numeral 86 wherein the fault detection signals diverge from the normal write operation signals depicted within FIG. 5. Those having ordinary skill in the art will appreciate that by coupling the fault detection signals created in this manner to appropriate logic gates an automated determination of the particular fault which has occurred may be efficiently and rapidly generated.

Figure 7:
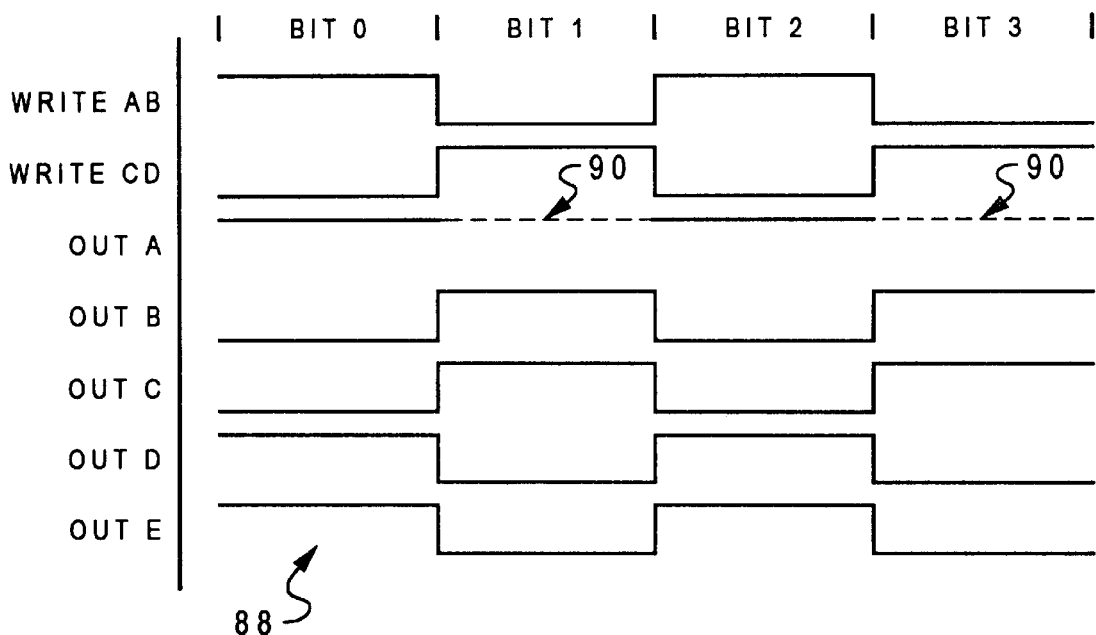
FIG. 7 illustrates a second specific fault condition.

With reference now to FIG. 7, there is depicted a pictorial representation of a plurality of unique fault detection circuits within the H configuration write driver circuit of the present invention which illustrate a second specific component fault condition. Specifically, the fault detection signals depicted within FIG. 7 are those signals generated as a result of a short circuit condition within drive transistor 34. As illustrated at reference numeral 90, the fault detection signals generated as a result of this condition are unique and are different from the fault signal conditions depicted within FIG. 6. In this manner, an accurate determination of component fault conditions may be accomplished utilizing these fault signals.

Figure 8:
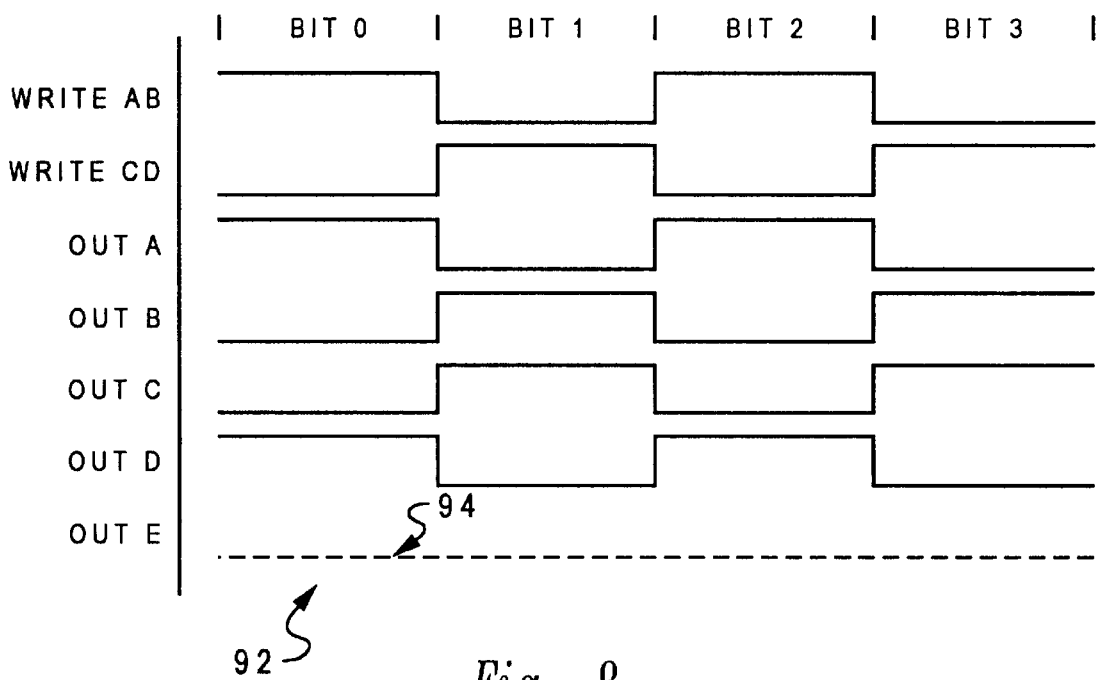
FIG. 8 illustrates a third specific fault condition.

Finally, with reference to FIG. 8, there is depicted a pictorial representation of a plurality of unique fault detection signals within the H configuration write driver circuit of the present invention which illustrate a third specific component fault condition. As illustrated within FIG. 8, the fault detection signal OUT E is absent, indicating an open condition in the write head or the cable coupled to the write head. Thus, It may be seen that a unique set of fault detection signals is generated for each possible component failure within the H configuration write driver circuit of the present invention. A service technician may rapidly and efficiently determine which drive transistor, resistor or record head is responsible for a fault condition, greatly enhancing the efficiency of repair of such devices.

While the invention has been particularly shown and described with reference to a preferred embodiment, it will be understood by those skilled in the art that various changes in form and detail may be made therein without departing from the spirit and scope of the invention.

What is claimed is:

1. An H configuration driver circuit for producing current flow through a load device, said H configuration driver circuit comprising:

first and second drive transistors coupled to said load device at opposite ends of said load device for producing a current flow through said load device in a first direction;

third and fourth drive transistors coupled to said load device at opposite ends of said load device for producing current flow through said load device in a second direction;

a resistor coupled in series between each drive transistor and said load device wherein current through a drive transistor is limited in the event of a short circuit condition therein, and a fault detection circuit coupled to each resistor for generating a plurality of fault detection signals in response to variations in voltages at each resistor.

2. The H configuration driver circuit according to claim 1, wherein said fault detection circuitry includes a comparator circuit having one input coupled to an associated voltage measurement node and a second input coupled to a predetermined reference voltage.

3. The H configuration driver circuit according to claim 1, wherein each drive transistor comprises a field effect transistor.

4. An H configuration write driver circuit for producing current flow through a magnetic tape recorder write head, said H configuration write driver circuit comprising:

first and second drive transistors coupled to said magnetic tape recorder write head at opposite ends of said magnetic tape recorder write head for producing a current flow through said magnetic tape recorder write head in a first direction;

third and fourth drive transistors coupled to said magnetic tape recorder write head at opposite ends of said magnetic tape recorder write head for producing current flow through said magnetic tape recorder write head in a second direction;

a resistor coupled in series between each drive transistor and said magnetic tape recorder write head wherein current flow through a driver transistor is limited in the event of a short circuit condition therein, and a fault detection circuit coupled to each resistor for generating a plurality of fault detection signals in response to variations in voltages at each resistor.

5. The H configuration driver circuit according to claim 4, wherein said fault detection circuitry includes a comparator circuit having one input coupled to an associated voltage measurement node and a second input coupled to a predetermined reference voltage.

6. The H configuration driver circuit according to claim 4, wherein each drive transistor comprises a field effect transistor.

* * * * *